United States Patent
Jiang et al.

(10) Patent No.: US 11,404,679 B2
(45) Date of Patent: Aug. 2, 2022

(54) METHOD OF PREPARING PEROVSKITE LIGHT-EMITTING LAYER AND DISPLAY APPLICATION THEREOF

(71) Applicant: SHENZHEN CHINA STAR OPTOELECTRONICS SEMICONDUCTOR DISPLAY TECHNOLOGY CO., LTD., Shenzhen (CN)

(72) Inventors: Pei Jiang, Shenzhen (CN); Chiayu Lee, Shenzhen (CN); Chunche Hsu, Shenzhen (CN); Shujhih Chen, Shenzhen (CN); Miao Duan, Shenzhen (CN); Yongming Yin, Shenzhen (CN); Yongwei Wu, Shenzhen (CN); Bo He, Shenzhen (CN)

( * ) Notice: Subject to any disclaimer, the term of this patent is extended or adjusted under 35 U.S.C. 154(b) by 320 days.

(21) Appl. No.: 16/627,361

(22) PCT Filed: Nov. 26, 2019

(86) PCT No.: PCT/CN2019/121020
§ 371 (c)(1),
(2) Date: Dec. 30, 2019

(87) PCT Pub. No.: WO2021/082144
PCT Pub. Date: May 6, 2021

(65) Prior Publication Data
US 2021/0367215 A1   Nov. 25, 2021

(30) Foreign Application Priority Data

Oct. 31, 2019   (CN) .......................... 201911049182.0

(51) Int. Cl.
*H01L 33/18* (2010.01)
*H01L 51/56* (2006.01)
(Continued)

(52) U.S. Cl.
CPC .............. *H01L 51/56* (2013.01); *C09K 11/06* (2013.01); *H01L 51/0077* (2013.01); *H01L 51/5032* (2013.01); *H01L 51/001* (2013.01)

(58) Field of Classification Search
CPC ................................ H01L 33/16; H01L 33/18
See application file for complete search history.

(56) References Cited

U.S. PATENT DOCUMENTS

2018/0309078 A1   10/2018   Ju et al.
2019/0062175 A1*   2/2019   Gao ..................... H01L 51/4246
(Continued)

FOREIGN PATENT DOCUMENTS

CN   107275523 A   10/2017
CN   107325812 A   11/2017
(Continued)

*Primary Examiner* — Jae Lee

(57) ABSTRACT

A method of preparing a film and a light-emitting device are disclosed. The method includes: providing at least one gas-phase source above a substrate, the at least one gas-phase source made of materials comprising a perovskite material; and controlling an evaporation rate of the at least one gas-phase source to form a perovskite film. In the method provided by the present invention, a perovskite light-emitting layer is prepared by gas-phase source evaporation coating without an organic solvent, which avoids miscibility between the organic solvent and other layers and improves compatibility between the perovskite material and other film materials, thereby realizing the low preparation cost and the simple preparation process.

9 Claims, 2 Drawing Sheets

(51) Int. Cl.
*C09K 11/06* (2006.01)
*H01L 51/00* (2006.01)
*H01L 51/50* (2006.01)

(56) References Cited

U.S. PATENT DOCUMENTS

| | | | |
|---|---|---|---|
| 2021/0233717 A1* | 7/2021 | Lunt | H01L 31/032 |
| 2021/0355576 A1* | 11/2021 | Braun | C23C 14/50 |
| 2021/0399246 A1* | 12/2021 | Snaith | H01L 51/0007 |
| 2021/0408384 A1* | 12/2021 | Han | H01L 51/5092 |

FOREIGN PATENT DOCUMENTS

| | | |
|---|---|---|
| CN | 109216547 A | 1/2019 |
| CN | 109713100 A | 5/2019 |
| CN | 109950412 A | 6/2019 |
| WO | 2018086114 A1 | 5/2018 |

* cited by examiner

METHOD OF PREPARING PEROVSKITE LIGHT-EMITTING LAYER AND DISPLAY APPLICATION THEREOF

BACKGROUND OF INVENTION

The present application claims priority to Chinese patent application no. 201911049182.0 submitted to Chinese Patent Office on Oct. 31, 2019, entitled "method of preparing perovskite light-emitting layer and display application thereof", the entire contents of which are incorporated herein by reference.

Field of Invention

The present application relates to a field of semiconductor material technology, and in particular, to a method of preparing a film and a light-emitting device.

Description of Prior Art

In recent years, perovskite materials have attracted widespread attention and research in academia and industry. Compared with organic light-emitting materials and traditional quantum dot light-emitting materials, the perovskite light-emitting materials have advantages of excellent photoelectric performance, low cost, and simple preparation process, etc.

At present, the common methods of preparing the perovskite light-emitting layer include spin-coating and inkjet-printing. However, an organic solvent is required by these methods in order to prepare a perovskite light-emitting laye, and use of the organic solvent limits material compatibility of the perovskite material in display applications. In addition, in the above methods, there are difficulties in the preparation process, such as precise controls of crystallization, film formation, and film thickness of the perovskite material.

SUMMARY OF INVENTION

The methods of preparing the perovskite film in the prior art generally use an organic solvent, which limits the material compatibility of the perovskite material in display applications. Meanwhile, the method of preparing the perovskite film in the prior art is difficult to accurately control the crystallization, film formation, and film thickness of the perovskite material, which are difficulties in the preparation process.

In order to solve the above problems, embodiments of the present invention provide a method of preparing a film and a light-emitting device.

In a first aspect, the present application provides a method of preparing a layer, and the method includes:

providing at least one gas-phase source above a substrate, the at least one gas-phase source made of materials including a perovskite material; and controlling an evaporation rate of the at least one gas-phase source to form a perovskite film.

Further, the step of controlling an evaporation rate of the at least one gas-phase source to form a perovskite film includes:

controlling the evaporation rate of the materials in the at least one gas-phase source, so that a chemical reaction occurs between the materials in the at least one gas-phase source to form the perovskite material; and depositing the perovskite material on the substrate to form the perovskite film.

Further, the method of preparing the film further includes: during preparation of the perovskite film, continuously rotating the substrate to improve uniformity of distribution of the perovskite material.

Further, the step of controlling an evaporation rate of the materials in the at least one gas-phase source to perform a chemical reaction between the materials in the at least one gas-phase source to form the perovskite material includes:

determining a molar ratio of substances in the perovskite material;

determining a target evaporation rate of each gas-phase source in the at least one gas-phase source according to the molar ratio of the substances;

respectively controlling an evaporation rate of each gas-phase source in the at least one gas-phase source to the target evaporation rate correspondingly, so that a chemical reaction occurs between materials of each gas-phase source in the at least one gas-phase source to obtain the perovskite material.

Further, the step of respectively controlling an evaporation rate of each gas-phase source in the at least one gas-phase source to the target evaporation rate correspondingly includes: using electron beams of different energies or high-energy laser beams of different energies to irradiate the gas-phase source to control the evaporation rate of the materials in the gas-phase source to the target evaporation rate correspondingly.

Further, the at least one gas-phase source includes only one gas-phase source, and the perovskite material is a perovskite single crystalline material or a perovskite polycrystalline material.

Further, the perovskite material has a general formula $ABX_3$, wherein A is a methylamine ion, a formamidine ion, or a cesium ion; B is a metal cation of a lead ion or a tin ion; and X is a halogen ion, a bromide ion, or an iodine ion.

Further, the at least one gas-phase source includes two gas-phase sources, which are perovskite precursor materials AX and $BX_2$, respectively; and A is a methylamine ion, a formamidine ion, or cesium ion; B is a metal cation of a lead ion or a tin ion; and X is a halogen ion, a bromide ion, or an iodine ion.

Further, the at least one gas-phase source includes three gas-phase sources, which are perovskite precursor materials (A1) X, (A2) X and $BX_2$, respectively; and wherein A1 and A2 are any two different ions of a methylamine ion, a formamidine ion or a cesium ion; B is a metal cation of a lead metal cation or a tin ion; and X is a halogen chloride ion, a bromide ion, or an iodine ion.

Further, the materials in the at least one gas-phase source have a filament shape, a granular shape, or a sheet shape.

Further, the method of preparing the film is performed in a vacuum environment at room temperature.

In a second aspect, the present application further provides a light-emitting device, the light-emitting device includes a light-emitting layer, and the light-emitting layer is a perovskite light-emitting layer.

Further, the perovskite light-emitting layer has a general formula $ABX_3$, wherein A is a methylamine ion, a formamidine ion, or a cesium ion; B is a metal cation of a lead ion or a tin ion; and X is a halogen ion, a bromide ion, or an iodine ion.

Further, the perovskite light-emitting layer has a general formula $A1A2BX_3$, wherein A1 and A2 are any two different ions of a methylamine ion, a formamidine ion or a cesium ion; B is a metal cation of a lead ion or a tin ion; and X is a halogen ion of a chloride ion, a bromide ion, or an iodine ion.

Further, the light-emitting device further includes: an anode, a hole transport region, an electron transport region, and a cathode.

Further, the hole transport region includes at least one of a hole injection layer and a hole transport layer.

Further, an electron transport region includes at least one of an electron injection layer and an electron transport layer.

Further, materials of the hole transport region and the electron transport region are matched with each other in energy level.

Further, the materials of the hole transport region and the electron transport region are selected from at least one of an organic material, an inorganic oxide, or a perovskite material.

Further, the hole transport region and the electron transport region are prepared by evaporation coating, spin-coating, inkjet-printing, or sputtering.

In the method of preparing the film provided by the embodiment of the present invention, a perovskite light-emitting layer is prepared by gas-phase source evaporation coating without an organic solvent, which avoids miscibility between the organic solvent and other layers and improves compatibility between the perovskite material and other film materials, thereby realizing the low preparation cost and the simple preparation process.

BRIEF DESCRIPTION OF DRAWINGS

In order to more clearly illustrate the embodiments or the technical solutions of the existing art, the drawings illustrating the embodiments or the existing art will be briefly described below. Obviously, the drawings in the following description merely illustrate some embodiments of the present invention. Other drawings may also be obtained by those skilled in the art according to these figures without paying creative work.

DETAILED DESCRIPTION OF PREFERRED EMBODIMENTS

Figure 1:
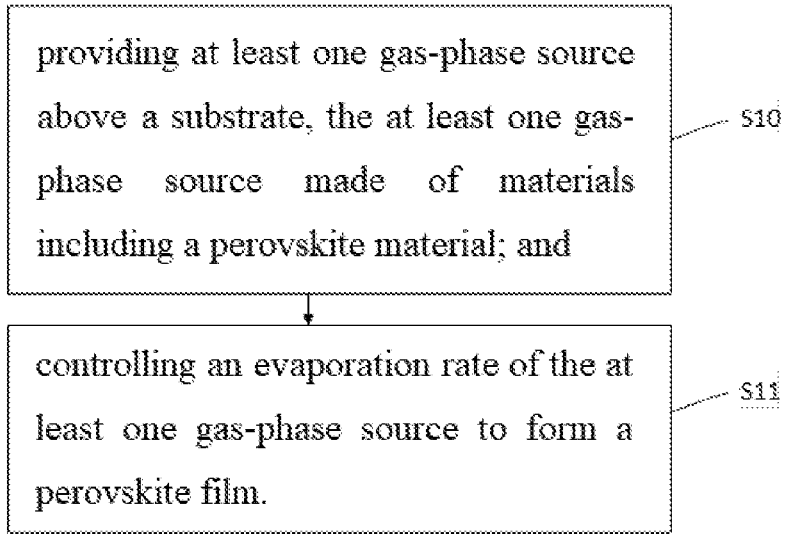
FIG. 1 is a schematic flowchart of a method of preparing a film according to an embodiment of the present invention.

Please refer to the FIG.s in the drawings, in which, like numbers refer to like elements throughout the description of the FIG.s. Hereinafter, the present invention will be described in further detail with reference to examples. It is to be understood, however, that these examples are for illustrative purposes only and are not intended to limit the scope of the present invention.

In the description of the present invention, it is to be understood that the terms "center", "longitudinal", "transverse", "length", "width", "thickness", "upper", "lower", "front", "post", "left", "right", "vertical", "horizontal", "top", "bottom", "inside", "outside", etc. demonstrating the orientation or positional relationship of the indications is based on the orientation shown in the drawings Or, the positional relationship is merely for the convenience of the description of the present invention and the simplification of the description, and is not intended to imply that the device or the component of the present invention has a specific orientation and is constructed and operated in a specific orientation, thus being not to be construed as limiting the present invention. Moreover, the terms "first" and "second" are used for descriptive purposes only and are not to be construed as indicating or implying a relative importance or not to implicitly indicate a number of technical features indicated. Thus, features defined by "first" or "second" may include one or more of the described features either explicitly or implicitly. In the description of the present invention, the meaning of "a plurality" is two or more unless specifically defined otherwise.

In the present application, the term "exemplary" is used to mean "serving as an example, illustration, or description." Any embodiment described as "exemplary" in the present application is not necessarily to be construed as preferred or advantageous over other embodiments. In order to enable any person skilled in the art to implement and use the present invention, the following description is given. In the following description, details are set forth for the purpose of explanation. It should be understood by one of ordinary skill in the art that the present invention may be implemented without the use of these specific details. In other embodiments, well-known structures and procedures are not described in detail to avoid obscuring the description of the present invention with unnecessary details. Accordingly, the present invention is not intended to be limited to the embodiments shown, but is to be accorded the widest scope consistent with the principles and features disclosed herein.

An embodiment of the present invention provides a film and a method of preparing the light-emitting device, which are described in detail below, respectively.

In a first aspect, an embodiment of the present invention provides a method of preparing a film as shown in FIG. 1, which is a schematic flowchart of a method of preparing a film according to an embodiment of the present invention, and the method of preparing a film according to an embodiment of the present invention includes:

S10, providing at least one gas-phase source above a substrate, the at least one gas-phase source made of materials including a perovskite material; and S11 controlling an evaporation rate of the at least one gas-phase source to form a perovskite film.

In the method of preparing the film provided by the embodiment of the present invention, a perovskite light-emitting layer is prepared by gas-phase source evaporation coating without an organic solvent, which avoids miscibility between the organic solvent and other layers and improves compatibility between the perovskite material and other film materials, thereby realizing the low preparation cost and the simple preparation process.

Specifically, in a vacuum evaporation coating apparatus, the at least one gas-phase source is provided above the substrate placed at normal temperature, and the at least one gas-phase source is filled with the perovskite material. By controlling the evaporation rate of the materials in the at least one gas-phase source, the desired perovskite film is formed on the substrate. The perovskite film prepared by this method is smooth and uniform without pinholes on its surface, and has good film formation quality.

Figure 2:
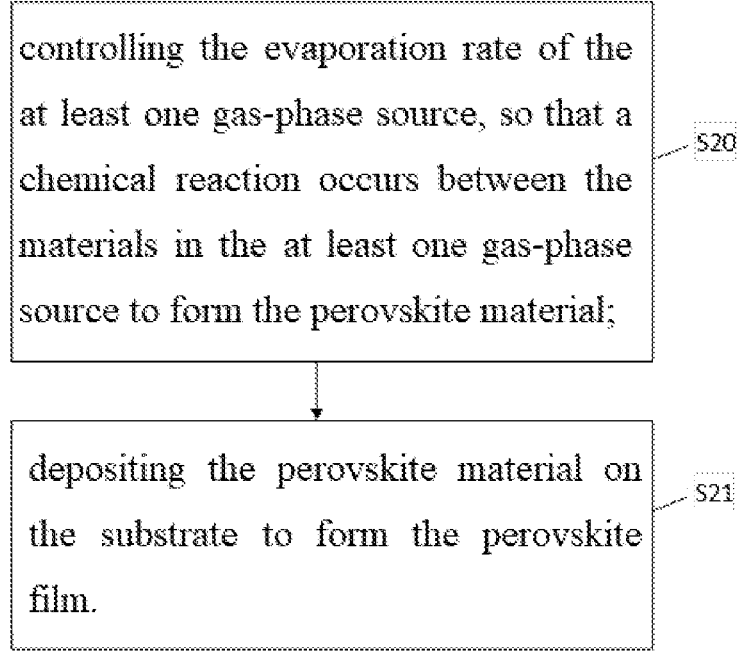
FIG. 2 is a schematic flowchart of the step S11 provided by an embodiment of the present invention.

In some embodiments of the present invention, as shown in FIG. 2, which is a schematic flowchart of the step S11 provided by an embodiment of the present invention, and the step S11 may include:

S20. controlling the evaporation rate of the at least one gas-phase source, so that a chemical reaction occurs between the materials in the at least one gas-phase source to form the perovskite material; and S21. depositing the perovskite material on the substrate to form the perovskite film.

Specifically, in the vacuum evaporation coating apparatus and at normal temperature, the materials in the at least one gas-phase source are heated, and a chemical reaction occurs between materials in different gas-phase sources to generate required perovskite molecules, and meanwhile, the perovskite molecules escape from the gas-phase sources to form a steam flow, which enters a surface of the substrate, and condenses into a solid film, that is, the perovskite film.

Concurrently, in order to improve uniformity of distribution of the perovskite film, the method may further include: during the preparation of the perovskite film, continuously rotating the substrate to improve uniformity of distribution of the perovskite material.

In the above embodiment, the materials in the at least one gas-phase source may have a filament shape, a granular shape, a sheet shape, or the like. Methods of heating the materials in the gas-phase source may be using electron beams of different energies or high-energy laser beams of different energies to irradiate the gas-phase source to control the evaporation rate of the materials in the gas-phase source, which is not particularly limited herein.

Figure 3:
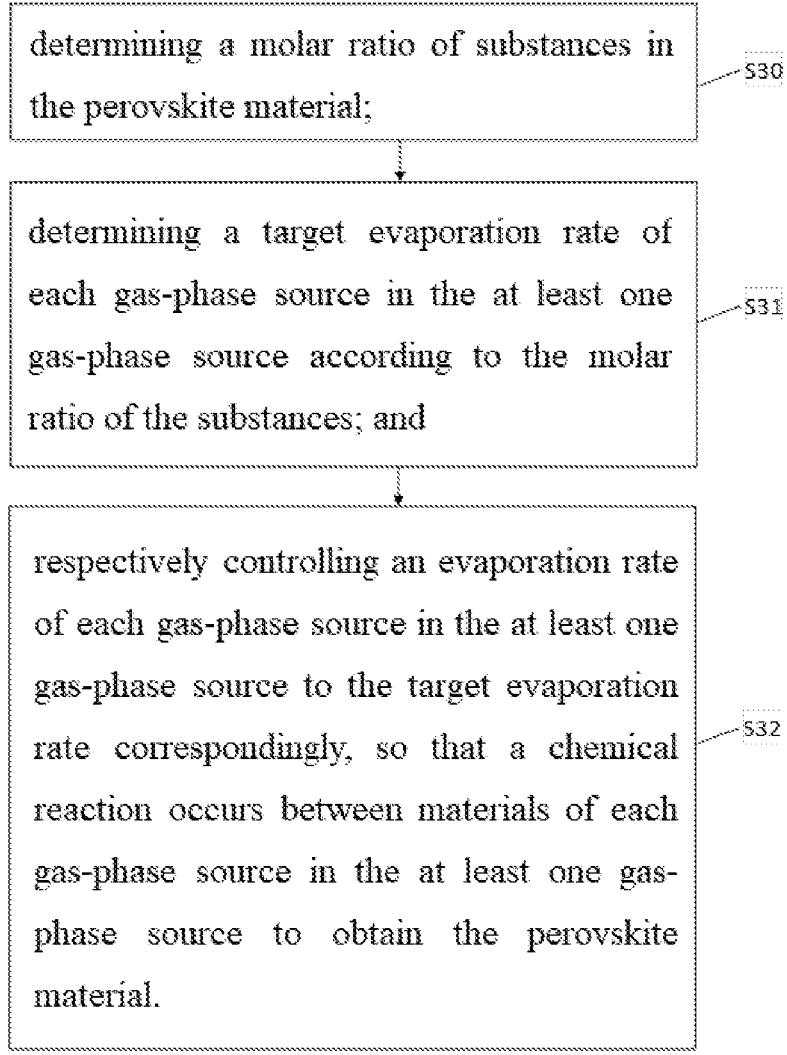
FIG. 3 is a schematic flowchart of the step S20 provided by an embodiment of the present invention.

Based on the above embodiment, as shown in FIG. 3, which is a schematic flowchart of the step S20 provided by an embodiment of the present invention, and the step S20 may further include:

S30. determining a molar ratio of substances in the perovskite material;

S31. determining a target evaporation rate of each gas-phase source in the at least one gas-phase source according to the molar ratio of the substances; and S32. respectively controlling an evaporation rate of each gas-phase source in the at least one gas-phase source to the target evaporation rate correspondingly, so that a chemical reaction occurs between materials of each gas-phase source in the at least one gas-phase source to obtain the perovskite material.

Specifically, the perovskite material has a general formula ABX3, and different perovskite materials are formed under different conditions. In an embodiment of the present invention, A in the general formula ABX3 of the perovskite material may be a methylamine ion (MA+), a formazan ion (FA+), a cesium ion (Cs+), and so on, B is a metal cation of a lead ion (Pb2+), a tin ion (Sn2+), and so on, and X is a halogen chloride ion (Cl—), a bromine ion (Br—), an iodine ion (I—), and so on.

In some embodiments of the present invention, when there is only one gas-phase source, the gas-phase source is filled with the perovskite material, and the perovskite material is vaporized into a perovskite single crystalline material or a perovskite polycrystalline material in an evaporation coating apparatus and directly deposited on the surface of the substrate to form the perovskite film.

In other embodiments of the present invention, there may be two gas-phase sources. In such a case, both gas-phase sources are filled with perovskite precursor materials, and different perovskite precursor materials undergo chemical reactions under different conditions to obtain the perovskite material.

Specifically, the two gas-phase sources can be filled with perovskite precursor materials AX and BX2, respectively, where A can be a methylamine ion (MA+), a formamidine ion (FA+), a cesium ion (Cs+), and so on, B is a metal cation of a lead ion (Pb2+), a tin ion (Sn2+), and so on, and X is a halogen chloride ion (Cl—), a bromine ion (Br—), an iodine ion (I—), and so on.

The two gas-phase sources are filled with different perovskite precursor materials. The perovskite precursor materials undergo chemical reactions under different conditions to obtain the perovskite materials, and the perovskite materials are deposited on the surface of the substrate to form the perovskite film.

Specifically, in this embodiment, the perovskite precursor materials in the two gas-phase sources may be MACl and PbCl2, respectively, and the chemical reaction thereof to form the perovskite material is shown in the following reaction scheme:

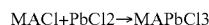

MACl+PbCl2→MAPbCl3

In this case, the perovskite material has a chemical formula MAPbCl3.

In other embodiments of the present invention, there may be three gas-phase sources. In such a case, the three gas-phase sources are filled with perovskite precursor materials, and different perovskite precursor materials undergo chemical reactions under different conditions to obtain the perovskite material.

Specifically, the perovskite precursor materials filled in the three gas-phase sources can be: (A1) X in a gas-phase source 1, (A2) X in a gas-phase source 2, and BX2 in a gas-phase source 3, wherein A1 and A2 are any two different ions of a methylamine ion (MA+), a formamidine ion (FA+), or a cesium ion; B is a metal cation of a lead ion (such as Pb2+) or a tin ion (such as Sn2+); and X is a halogen ion of a chloride ion (such as Cl—), a bromide ion (such as Br—), an iodine ion (such as I—), and so on. In such a case, the perovskite material may have a general formula of A1A2BX3.

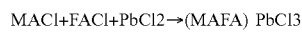

MACl+FACl+PbCl2→(MAFA) PbCl3

In the above embodiments, the perovskite precursor materials of the three gas-phase sources may be MACl, FACl, and PbCl2, respectively, and the chemical reaction thereof to form the perovskite material is shown in the following reaction scheme:

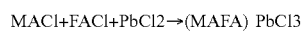

MACl+FACl+PbCl2→(MAFA) PbCl3

The present invention also provides a light-emitting device, which is a perovskite electroluminescent device. The light-emitting device includes a light-emitting layer, and the light-emitting layer is a perovskite light-emitting layer.

Figure 4:
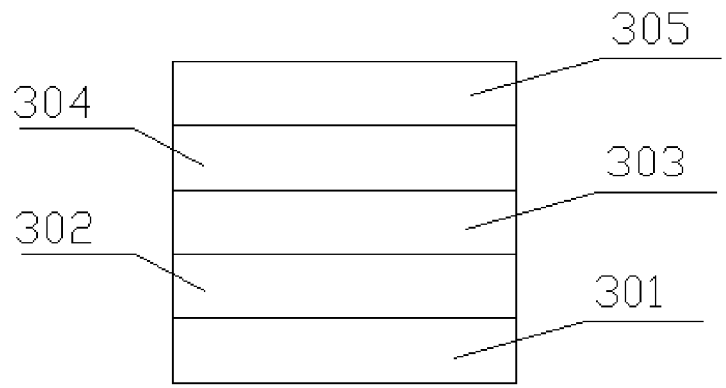
FIG. 4 is a schematic structural diagram of a light-emitting device according to an embodiment of the present invention.

In a specific embodiment, as shown in FIG. 4, which is a schematic structural diagram of a light-emitting device according to an embodiment of the present invention, the light-emitting device includes: an anode 301, a hole transport region 302, a perovskite light-emitting layer 303, an electron transport region 304, and a cathode 305.

In the light-emitting device provided by the present invention, a perovskite light-emitting layer is prepared by gas-phase source evaporation coating without an organic solvent, which avoids miscibility between the organic solvent and other layers and improves compatibility between the perovskite material and other film materials, thereby realizing the low preparation cost and the simple preparation process.

The hole transport region may include at least one of a hole injection layer and a hole transport layer, the electron transport region may include at least one of an electron injection layer and an electron transport layer. The materials of the hole transport region and the electron transport region are matched with each other in energy level. The materials of the hole-transport region and the electron-transport region may be selected from at least one of an organic material, an inorganic oxide, or a perovskite material, and the hole transport region and the electron transport region are prepared by a method including, but is not limited to, evaporation coating, spin-coating, inkjet-printing, or sputtering.

It should be noted that the above-mentioned light-emitting device provided by the embodiments only describes the above-mentioned structure. It can be understood that, in addition to the above-mentioned structure, the light-emitting device according to an embodiment of the present invention may further include any other necessary structures, such as a substrate, a buffer layer, and an interlayer dielectric layer (ILD), etc., which are not specifically limited herein.

The present invention also applies the method of preparing a perovskite film by evaporation coating to the preparation of a perovskite light-emitting layer in combination with an LED as a backlight. The backlight may be a direct-type backlight module or an edge-lit type backlight module.

In the above embodiments, the description of each embodiment has its own emphasis. For the parts that are not described in detail in an embodiment, refer to the detailed descriptions of other embodiments above, which will not be repeated herein for brevity.

In specific implementation, each of the above units or structures may be implemented as independent entities, or any combination may be implemented as the same or several entities. Specific implementation of the above units or structures may be referred to the foregoing method embodiments, and details are not repeated herein for brevity.

Specific implementation of the foregoing operations may be referred to the foregoing embodiments, and details are not repeated herein for brevity.

The method of preparing a film and the light-emitting device provided by the embodiments of the present invention have been described in detail above. Specific examples are used in this document to explain the principles and implementation of the present invention. The descriptions of the above embodiments are only for understanding the method of the present invention and its core idea; Meanwhile, for those skilled in the art, according to the idea of the present invention, there will be changes in the specific implementation and application scope. In summary, the content of this specification should not be construed as a limitation on the present invention.

What is claimed is:

1. A method of preparing a film, comprising:
   providing at least one gas-phase source above a substrate, the at least one gas-phase source made of materials comprising a perovskite material; and
   controlling an evaporation rate of the at least one gas-phase source to form a perovskite film;
   wherein the at least one gas-phase source comprises three gas-phase sources, which are perovskite precursor materials (A1) X, (A2) X and BX2, respectively; and
   wherein A1 and A2 are any two different ions of a methylamine ion, a formamidine ion or a cesium ion; B is a metal cation of a lead metal cation or a tin ion; and X is a halogen chloride ion, a bromide ion, or an iodine ion.

2. The method of preparing the film according to claim 1, wherein the step of controlling an evaporation rate of the at least one gas-phase source to form a perovskite film comprises:
   controlling the evaporation rate of the materials in the at least one gas-phase source, so that a chemical reaction occurs between the materials in the at least one gas-phase source to form the perovskite material; and
   depositing the perovskite material on the substrate to form the perovskite film.

3. The method of preparing the film according to claim 2, further comprising: during preparation of the perovskite film, continuously rotating the substrate to improve uniformity of distribution of the perovskite material.

4. The method of preparing the film according to claim 2, wherein the step of controlling an evaporation rate of the materials in the at least one gas-phase source to perform a chemical reaction between the materials in the at least one gas-phase source to form the perovskite material comprises:
   determining a molar ratio of substances in the perovskite material;
   determining a target evaporation rate of each gas-phase source in the at least one gas-phase source according to the molar ratio of the substances; and
   respectively controlling an evaporation rate of each gas-phase source in the at least one gas-phase source to the target evaporation rate correspondingly, so that a chemical reaction occurs between materials of each gas-phase source in the at least one gas-phase source to obtain the perovskite material.

5. The method of preparing the film according to claim 4, wherein the step of respectively controlling an evaporation rate of each gas-phase source in the at least one gas-phase source to the target evaporation rate correspondingly comprises: using electron beams of different energies or high-energy laser beams of different energies to irradiate the gas-phase source to control the evaporation rate of the materials in the gas-phase source to the target evaporation rate correspondingly.

6. The method of preparing the film according to claim 1, wherein the at least one gas-phase source comprises only one gas-phase source, and the perovskite material is a perovskite single crystalline material or a perovskite polycrystalline material.

7. The method of preparing the film according to claim 1, wherein the perovskite material has a general formula ABX3, wherein A is a methylamine ion, a formamidine ion, or a cesium ion; B is a metal cation of a lead ion or a tin ion; and X is a halogen ion, a bromide ion, or an iodine ion.

8. The method of preparing the film according to claim 1, wherein the at least one gas-phase source comprises two gas-phase sources, which are perovskite precursor materials AX and BX2, respectively; and
   A is a methylamine ion, a formamidine ion, or cesium ion; B is a metal cation of a lead ion or a tin ion; and X is a halogen ion, a bromide ion, or an iodine ion.

9. The method of preparing the film according to claim 1, which is performed in a vacuum environment at room temperature.

* * * * *